(12) United States Patent
Olsen et al.

(10) Patent No.: US 6,528,426 B1
(45) Date of Patent: Mar. 4, 2003

(54) INTEGRATED CIRCUIT INTERCONNECT AND METHOD

(75) Inventors: Leif C. Olsen, Plano, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/419,176

(22) Filed: Oct. 15, 1999

Related U.S. Application Data

(60) Provisional application No. 60/104,454, filed on Oct. 16, 1998.

(51) Int. Cl.[7] ............................................. H01L 21/302
(52) U.S. Cl. ........................................ 438/689; 694/700
(58) Field of Search ................................. 438/692, 700, 438/694

(56) References Cited

U.S. PATENT DOCUMENTS

| | | | | |
|---|---|---|---|---|
| 4,351,894 A | * | 9/1982 | Yonezawa et al. | 430/313 |
| 5,362,669 A | * | 11/1994 | Boyd et al. | 438/437 |
| 5,578,523 A | * | 11/1996 | Fiordalice et al. | 438/633 |
| 5,817,572 A | * | 10/1998 | Chiang et al. | 438/624 |
| 5,958,793 A | * | 8/1999 | Patel et al. | 438/692 |

* cited by examiner

*Primary Examiner*—Benjamin L. Utech
*Assistant Examiner*—Lynette T. Umez-Eronini
(74) *Attorney, Agent, or Firm*—Carlton H. Hoel; W. James Brady; Frederick J. Telecky, Jr.

(57) ABSTRACT

An inlaid interconnect fabrication method using a silicon carbide polish stop layer for protection of mechanically weak dielectric such as porous silicon dioxide (xerogel) during chemical mechanical polishing.

2 Claims, 8 Drawing Sheets

US 6,528,426 B1

INTEGRATED CIRCUIT INTERCONNECT AND METHOD

RELATED APPLICATIONS

This application claims priority from provisional application Serial No. 60/104,454, filed 10/16/98.

The following copending patent applications disclose related subject matter: Ser. No. 09/217,123, filed 12/21/98 (T26419). These applications have a common assignee with the present application.

BACKGROUND OF THE INVENTION

The invention relates to electronic semiconductor devices, and, more particularly, to dielectric structures and fabrication methods for such structures.

The performance of high density integrated circuits is dominated by metal interconnect level RC time delays due to the resistivity of the metal lines and the capacitive coupling between adjacent lines. The capacitive coupling can be reduced by decreasing the relative permittivity (dielectric constant, k) of the dielectric (electrical insulator) between adjacent lines.

Various dielectric materials have been suggested for use in silicon integrated circuits to replace the commonly used silicon dioxide (k about 4.0). The leading candidates are fluorinated silicon dioxide (k about 3.0–4.0), organic polymers such as polyimide, parylene, amorphous teflon (k about 1.9–3.9), and porous dielectrics such as silicon dioxide xerogels (k dependent upon pore size and typically 1.3–3.0).

Similarly, decreasing the resistivity of the interconnect metal by substituting copper (or silver) for the commonly used aluminum and tungsten will also reduce the RC time constant.

However, copper interconnects typically require an inlaid (damascene) process for fabrication which uses chemical mechanical polishing (CMP), and CMP can easily damage the mechanically fragile xerogel. In addition, standard post-CMP cleanup techniques, such as those involving buff processing, megasonic chemical baths, high pressure sprays, and brush scrubbing of wafer surfaces have been ineffective in cleaning xerogel material. In particular, in the fabrication of integrated circuits involving copper inlaid processes, when the copper is polished from the surface of the xerogel, the xerogel has shown susceptibility to being damaged. Further, copper compounds in CMP slurries can diffuse into the xerogel, and removal of the copper compounds cannot be accomplished without damage to the xerogel.

Thus the current xerogel with copper interconnects using CMP processing have manufacturing problems.

SUMMARY OF THE INVENTION

The present invention provides silicon carbide layers as polish and etch stops on a dielectric with the silicon carbide also acting as a protection layer during cleanup and as a diffusion barrier during and after polishing. Preferred embodiments include an adhesion layer between the dielectric and the silicon carbide. The silicon carbide can remain as part of the final interconnect structure or be removed.

This has the advantage of robust CMP processing, including polishing metal damascene structures imbedded in relatively fragile dielectrics such as xerogels, parylenes, amorphous teflon, and other amorphous polymers, and additionally with other low-k dielectrics such as high density plasma fluorinated silicon dioxide and benzocyclobutenes.

Of course, non-low-k dielectrics such as plasma enhanced tetraethoxysilane (PETEOS) oxides, siloxanes, and undoped high density plasma oxides may also be used. A further advantage is that the SiC etch and polish stop layers will have a lower dielectric constant (4.5–6) than the conventionally used $Si_3N_4$ (8).

BRIEF DESCRIPTION OF THE DRAWINGS

The drawings are heuristic for clarity.

DESCRIPTION OF THE PREFERRED EMBODIMENTS

Overview

The preferred embodiments provide silicon carbide CMP polish stop and etch stop layers for a dielectric with limited mechanical strength or diffusion barrier properties and thereby allows inlaid (damascene) type interconnects. Such dielectrics include xerogels and parylenes; and inlaid processing permits copper metallization. Other dielectrics may be used including low-k dielectrics such as amorphous teflon, other amorphous polymers, high density plasma fluorinated silicon dioxide, and benzocyclobutenes plus non-low-k dielectrics such as plasma enhanced tetraethoxysilane (PETEOS) oxides, siloxanes, and undoped high density plasma oxides.

First Preferred Embodiment

FIGS. 1a–1l illustrate in cross sectional elevation views the steps of first preferred embodiment fabrication methods for integrated circuits (e.g., CMOS or BiCMOS) which use metal plugs in the premetal dielectric (PMD) with single inlaid (damascene) first level metal plus dual inlaid second and higher level metal interconnects as follows.

Figure 1A:
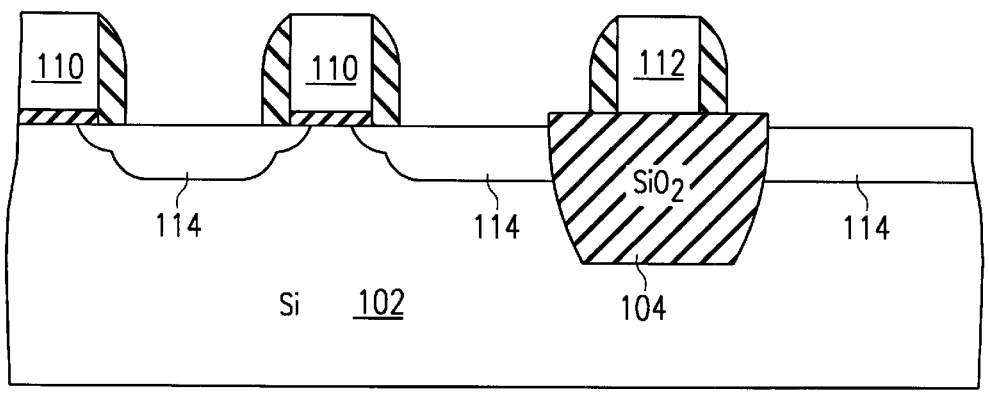
FIGS. 1a–1l are cross sectional elevation views of the steps of a preferred embodiment integrated circuit fabrication method.

(1) Start with a silicon wafer (or silicon on insulator wafer) with shallow trench isolation and twin wells for CMOS devices (optionally, plus memory cell array wells and bipolar device buried layers). Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates plus gate level interconnects. The gate material could also provide a polysilicon emitter for bipolar devices which would also require a prior base implant. See FIG. 1a which shows silicon substrate 102 with shallow trench isolation oxide 104 plus gates 110 and gate level interconnect 112. Gates 110 may be 200–300 nm high and 100–200 nm long (FIG. 1a is a cross section along the gate length, and gates typically have widths much greater than their lengths). An alternative would be formation of polysilicon gates followed by a self-aligned silicidation (after the source/drain and sidewall spacer formation of the next step) to create a silicide on both the gate top and the source/drains.

Figure 1B:
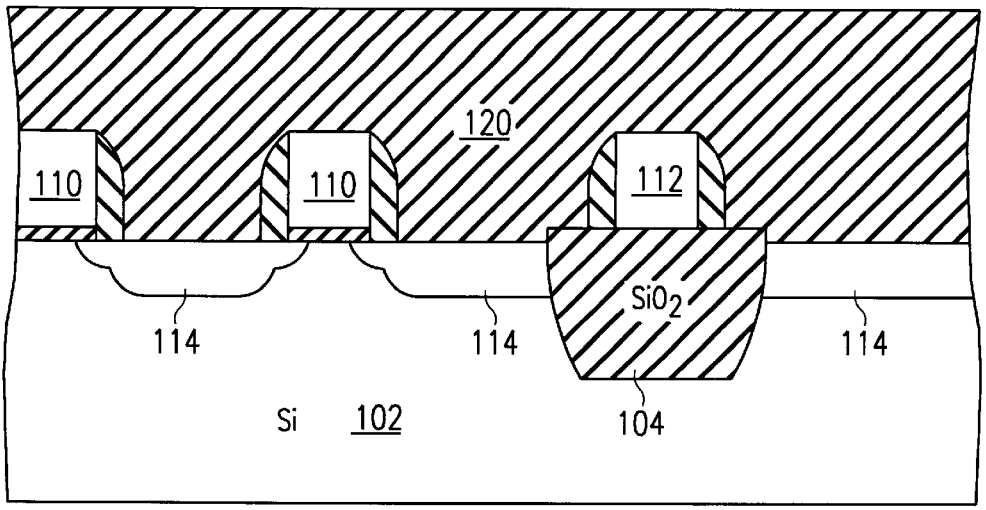
Figure 1C:
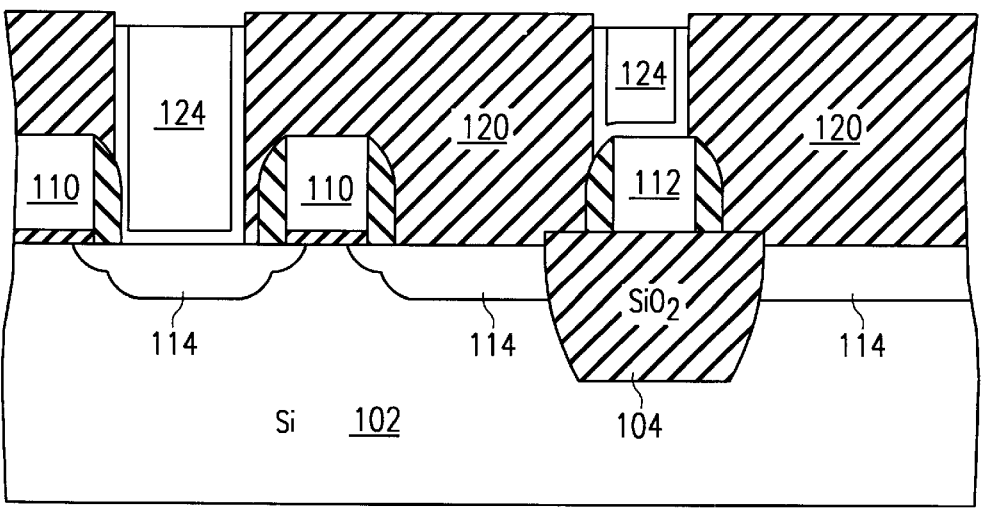
Figure 1D:
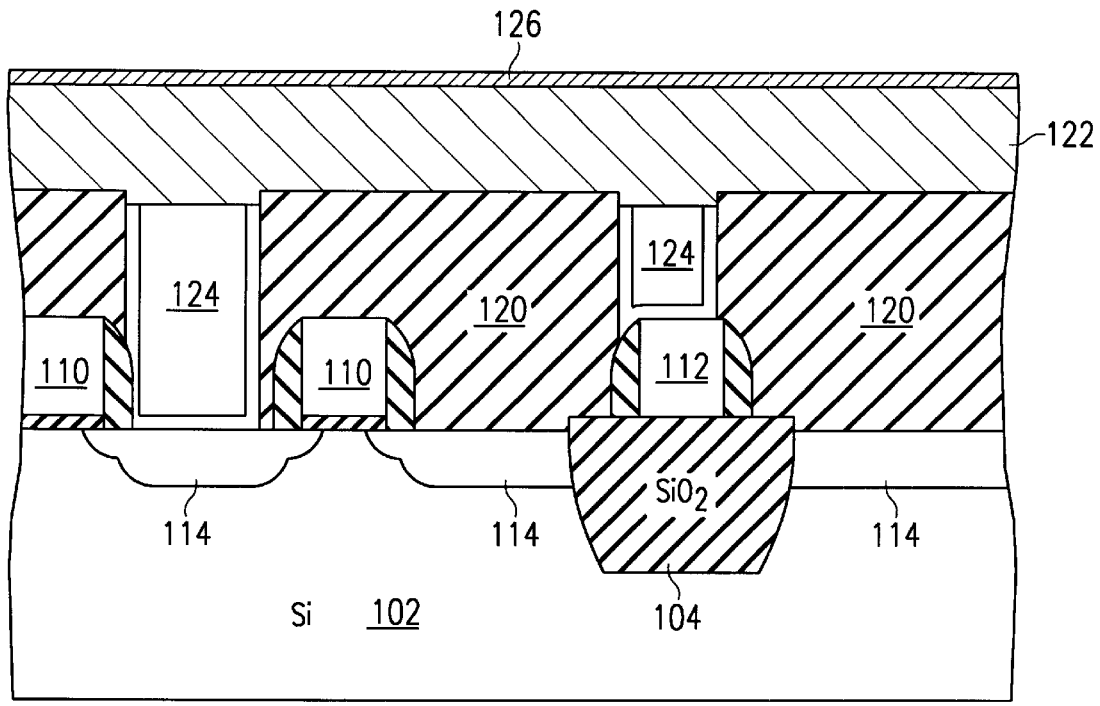
Figure 1E:
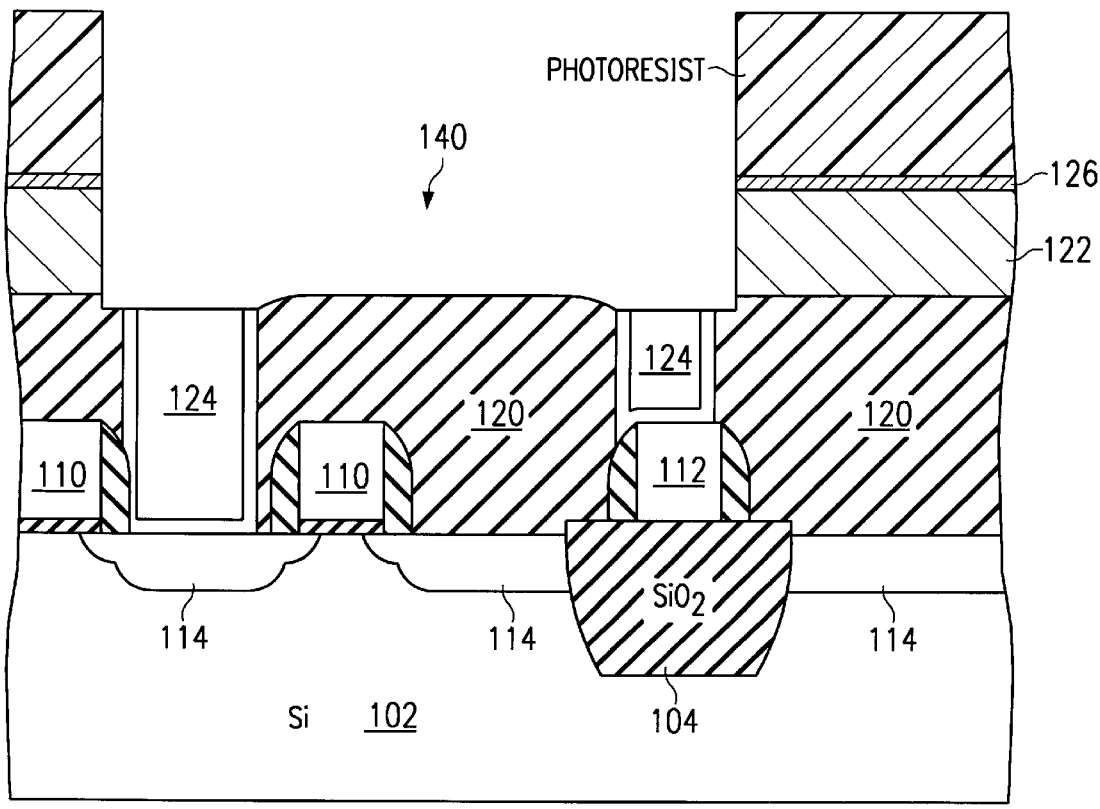
Figure 1F:
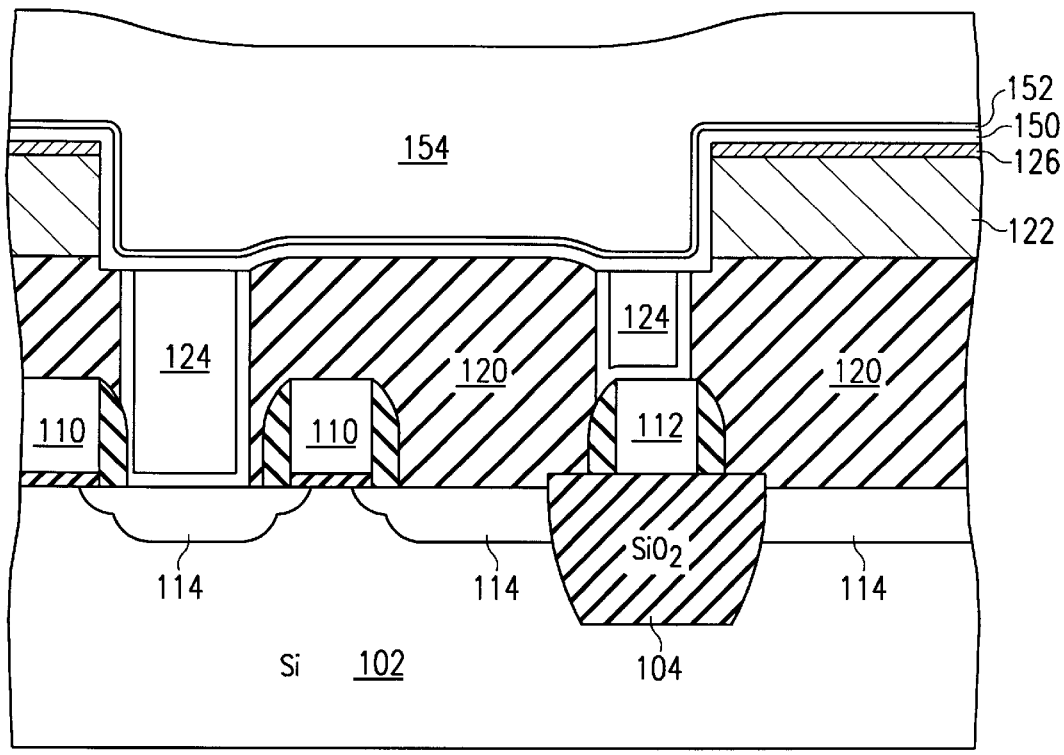
Figure 1G:
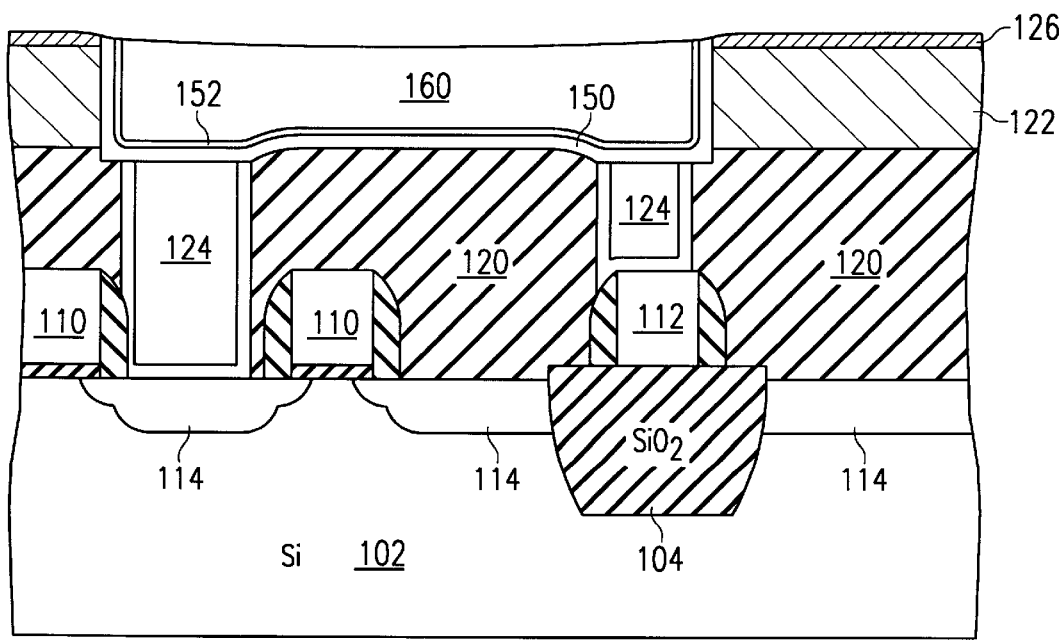
Figure 1H:
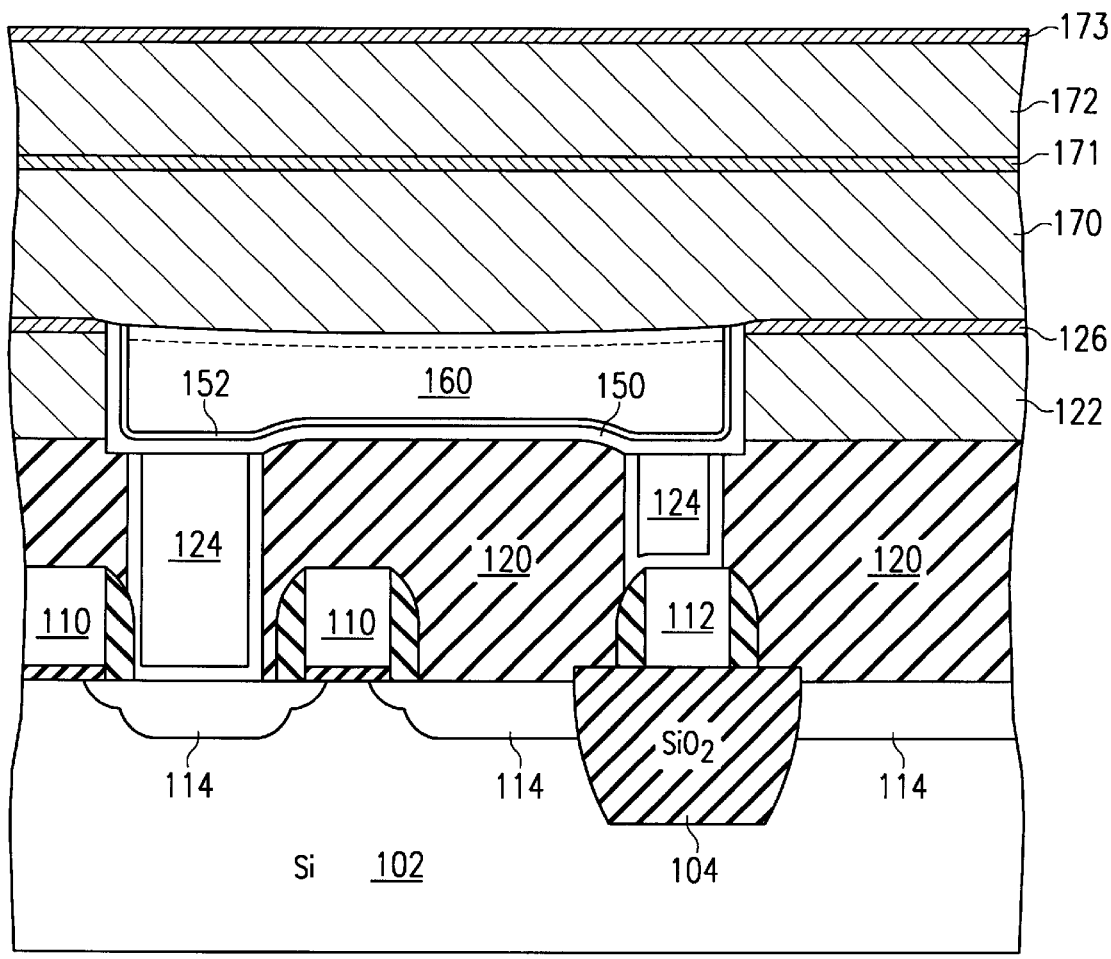
Figure 1I:
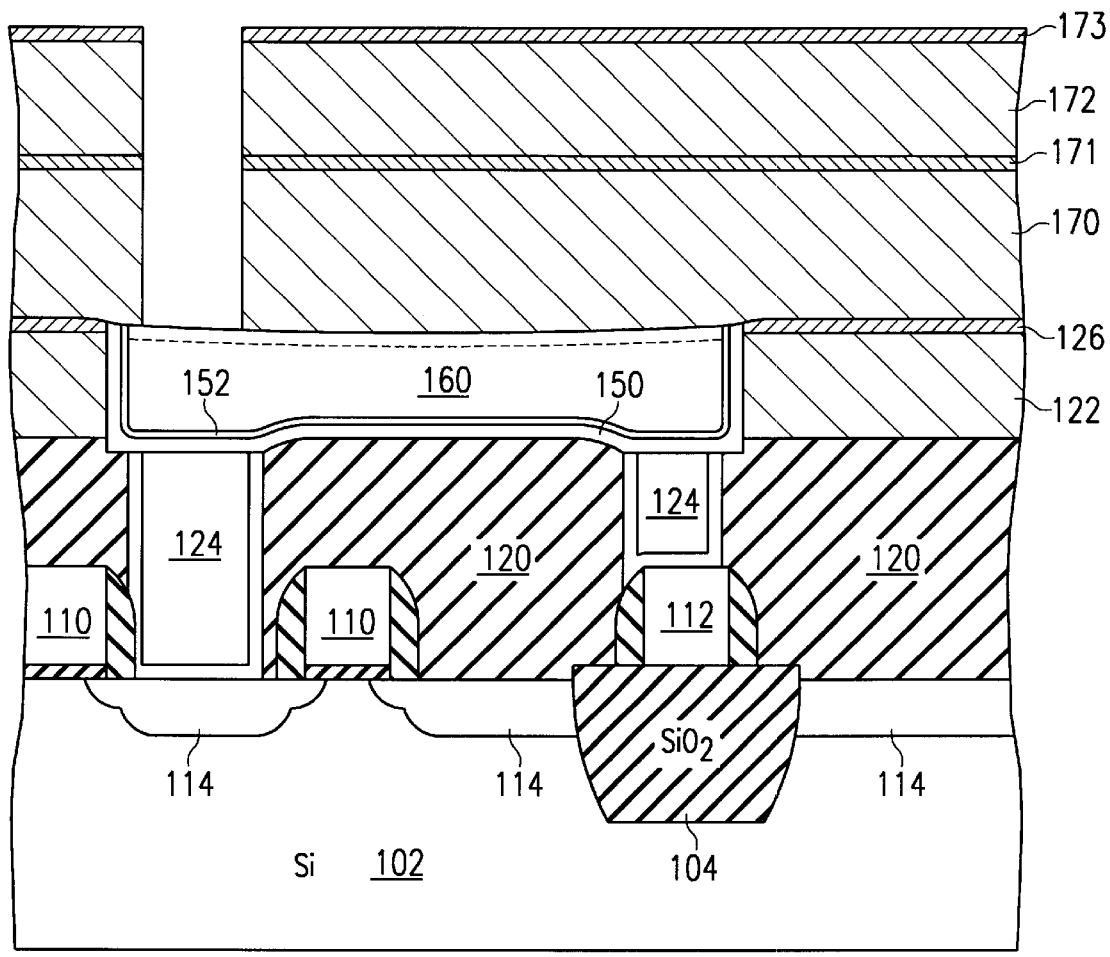
Figure 1J:
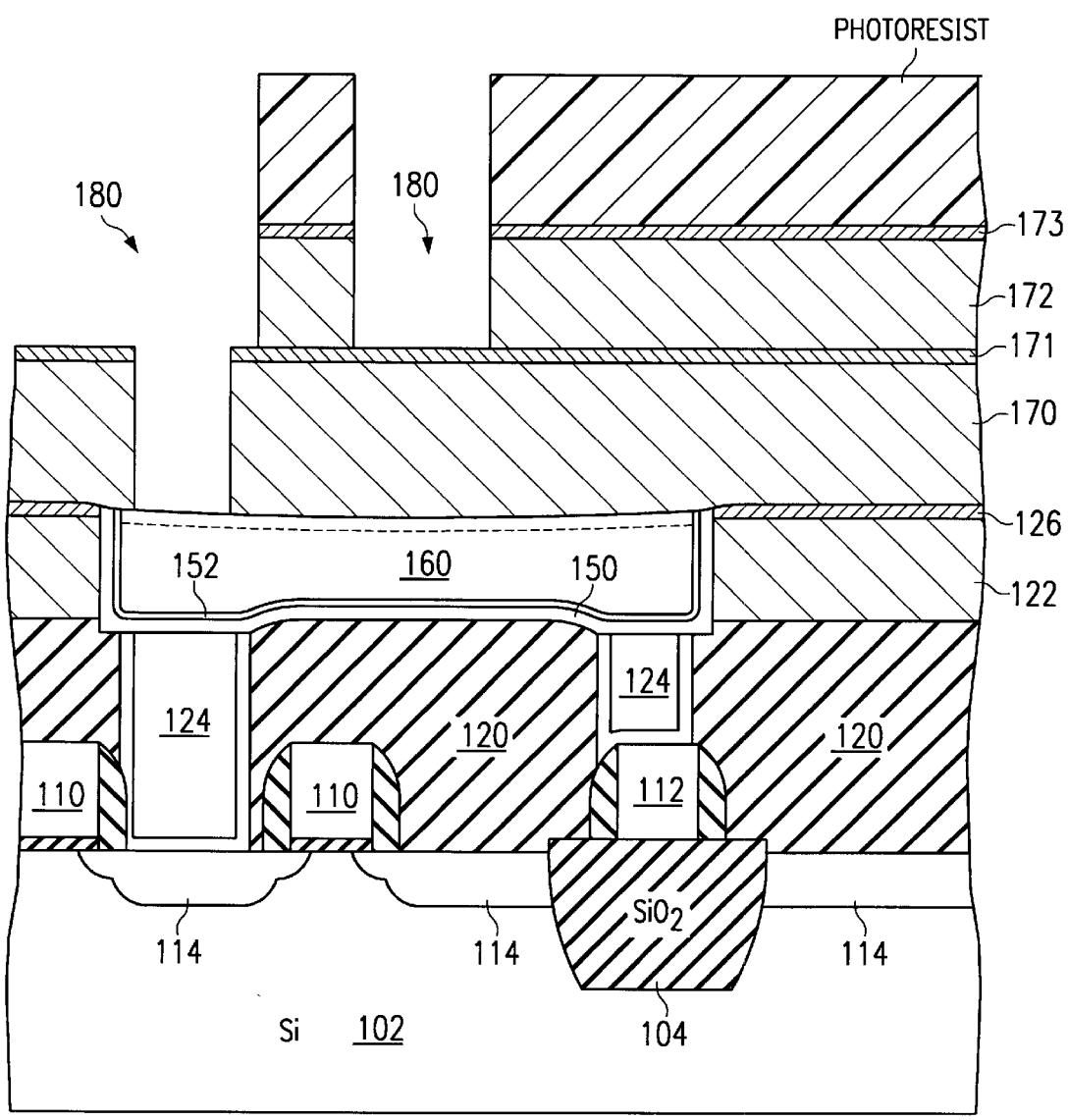

(2) Perform lightly doped drain implants, and then form sidewall spacer on the gates by deposition plus anisotropic etching of a dielectric such as oxide or nitride. Optionally, selectively grow silicon to raise the source/drains. Introduce dopants to form sources and drains 114. Cover the gate level structure with a planarized dielectric layer 120 (such as BPSG or a stack of conformal and planarized layers with the top layer a doped oxide); see FIG. 1b showing dielectric layer 120 having a thickness of roughly 800 nm. The doped oxide is a gettering layer for impurities diffusing from higher levels towards the transistors.

(3) For a structure with an embedded memory cell array using one-transistor one-capacitor memory cells, the bitlines and cell capacitors may be formed next. For clarity such steps are not illustrated and attendant additional dielectrics deposited on dielectric 120 will just be considered part of dielectric 120.

(4) Spin on photoresist and expose it to define locations for holes (contacts, vias) in planarized dielectric 120 which will extend down to selected source/drains 114 and areas on gate level interconnects 112 (and also to selected bitline areas for embedded memory). These vias will have minimal dimensions; e.g., diameters of 100–200 nm. Etch the vias with a high density, low pressure plasma of CF4+CHF3+O2, and then strip the photoresist.

(5) Blanket deposit (including filling vias) a metal stack such as 20 nm of Ti, 20 nm of TiN, 200 nm of W or Al (doped with Cu and Si); the bottom Ti and TiN form a diffusion barrier. Prior to the W or Al deposition the bottom Ti may be reacted with the source/drain to form a silicide to stabilize the metal-to-silicon contact. The Ti and TiN may be deposited by physical vapor deposition (PVD) or chemical vapor deposition (CVD) (e.g., TDMAT+NH3→TiN+N2+ CH4); the aluminum may be deposited by PVD and then forced into the vias under high pressure or by CVD; and W may be deposited by CVD using WF6 and H2. Etchback or chemically mechanically polish (CMP) to remove all of the metal except metal plugs 124 in the vias. The oxide-based dielectric 120 has sufficient strength and diffusion barrier properties to withstand the CMP and subsequent cleaning. See FIG. 1c.

(6) Spin on xerogel precursor (e.g., hydrolyzed TEOS oligomers in an ethanol plus glycol solvent), polymerize with NH4OH catalyst, and dry with hydrophobic surface modification to form xerogel dielectric 122 having a thickness of roughly 300 nm. Then increase the xerogel surface adhesiveness by hydrogen plasma removal of surface hydrophobic groups (e.g., replace methyl groups with hydrogen).

Other dielectrics could be used, including both low-k dielectrics such as PECVD deposited porous silicon oxycarbides, parylenes, amorphous teflon, other amorphous polymers, high density plasma fluorinated silicon dioxide and benzocyclobutenes and non-low-k dielectrics such as plasma enhanced tetraethoxysilane (PETEOS) oxides, siloxanes, and undoped high density plasma oxides.

(7) Deposit a 20–50 nm thick layer 126 of silicon carbide (SiC) by plasma enhanced CVD (PECVD) with source gasses silane plus methane (or trimethy-silane or other organosilicon gas) in an inert carrier gas (e.g., Ar or He) at a total pressure of 2 Torr (0.3 Pa) with an RF power density of 0.25 watt/cm2 and with a wafer temperature of 350 C. Layer 126 will act as a polish stop and diffusion barrier in subsequent CMP of metal filling inlaid interconnect trenches etched in xerogel 122. See FIG. 1d.

(8) Spin on photoresist 132 and expose it to define locations for trenches 140 in xerogel dielectric 122 which will be filled with metal to form the interconnects. The minimal spacing between adjacent trenches will be about 150–300 nm, so free-standing SiC topped xerogel strips will have an aspect ratio of at most roughly 2 to 1. Etch the silicon carbide and xerogel. The etch may be a single step anisotropic fluorine-based plasma etch, such as CF4+ CHF3+O2+Ar which etches both SiC and xerogel (essentially porous silicon dioxide) or a two step etch with a chlorine-based plasma etch, such as Cl2, to etch the SiC followed by a fluorine-based plasma etch to etch the xerogel. Because the xerogel has high porosity, it etches much faster than oxide, so an overetch will not remove much of underlying dielectric 120 or metal plugs 124. Alternatively, dielectric 120 could have a SiC or nitride upper portion to provide a more selective etchstop for the xerogel trench etch. See FIG. 1e.

Strip the photoresist with an oxygen or hydrogen plasma.

(9) Blanket deposit 10–30 nm thick TiN conformal barrier layer 150 by PVD or CVD. Other barrier materials include TaN, Ta2N, W2N and TiSiN (which can be formed by silane treatment of amorphous TiN). The hydrophobic surface of xerogel 122 may not provide sufficient adhesion for the barrier layer, so activate the xerogel surface by removing the hydrophobic methyl groups in a hydrogen plasma. Also, CVD TiN provides better sidewall coverage than PVD, so use a CVD process such as ammonia plus tetrakis (dimethylamino) titanium (TDMAT). Next, deposit (e.g., CVD, PVD) 50–100 nm thick copper seed layer 152 on the TiN, and then electroplate copper 154 to fill the interconnect trenches etched in the xerogel 122 plus cover the remainder of the wafer. See FIG. 1f.

(10) Remove the portion of copper and TiN barrier outside of the interconnect trenches by CMP; the CMP also planarizes any bumpiness in the plated copper. Initially use a hard pad to planarize, and then follow with a soft pad. Silicon carbide barrier layer 126 acts as a CMP polish stop to protect xerogel 122 and also acts as a diffusion barrier to impurities in the CMP slurries which could diffuse into the pores of xerogel 122. Copper polishes more than 100 times as fast as SiC. The remaining copper forms interconnects 160; see FIG. 1g.

(11) Passivate the exposed top surface of copper interconnects 160 by either a blanket deposition of 10–50 nm of silicon carbide or nitride or a more involved passivation such as: blanket deposition of Ti (e.g., by sputtering) followed by a reaction to form $Cu_3Ti$, a wet strip of the unreacted Ti, and a plasma nitridation in ammonia to form TiN. Again, the silicon carbide will protect xerogel 122 during the unreacted Ti strip and subsequent nitridation. This completes the first level metal.

Silicon carbide barrier layer 126 may be etched off after the polishing and passivation (with a Cl2 plasma for selectivity to the xerogel) or left in place. The thinness of silicon carbide 126 together with its modest dielectric constant (k=4.5–6) implies leaving layer 126 in place will not greatly affect interconnect capacitive coupling.

For the second and higher metal level interconnects, roughly repeat the foregoing steps but with dual inlaid (damascene) processing as follows.

(12) Form 500 nm thick xerogel dielectric layer 170 as previously described (spin on xerogel precursors, polymerize, dry, hydrophobize, treat the surface); next, deposit a 10–30 nm thick layer of silicon carbide 171; and then form 300 nm thick xerogel dielectric layer 172. The silicon carbide will be an etch stop for the interconnect trench etch. Then deposit 10–50 nm thick silicon carbide layer 173 by PECVD with trimethylsilane, silane plus methane, or other organosilicon gas; see FIG. 1h.

Of course, other dielectrics could be used, including both low-k dielectrics such as porous silicon oxycarbides, parylenes, amorphous teflon, other amorphous polymers, high density plasma fluorinated silicon dioxide and benzocyclobutenes and non-low-k dielectrics such as plasma enhanced tetraethoxysilane (PETEOS) oxides, siloxanes, and undoped high density plasma oxides.

(13) Spin on photoresist and expose and develop to define locations for vias. Next, etch vias through silicon carbide, xerogel, silicon carbide, and xerogel to end on interconnects 160. Then strip the photoresist. Again, one step or multistep etching could be used; see FIG. 1i.

(14) Spin on second photoresist and expose and develop it to define locations for next level interconnect trenches 180 in silicon carbide capped xerogel dielectric 172. Analogous to the first level metal, the trenches and vias will be filled with metal to form the next level interconnects. With a plasma etch of CHF3+CF4+Ar, etch trenches through 300 nm thick xerogel 172 down to silicon carbide etch stop 171; see FIG. 1j.

(15) Strip photoresist with oxygen plasma.

Figure 1K:
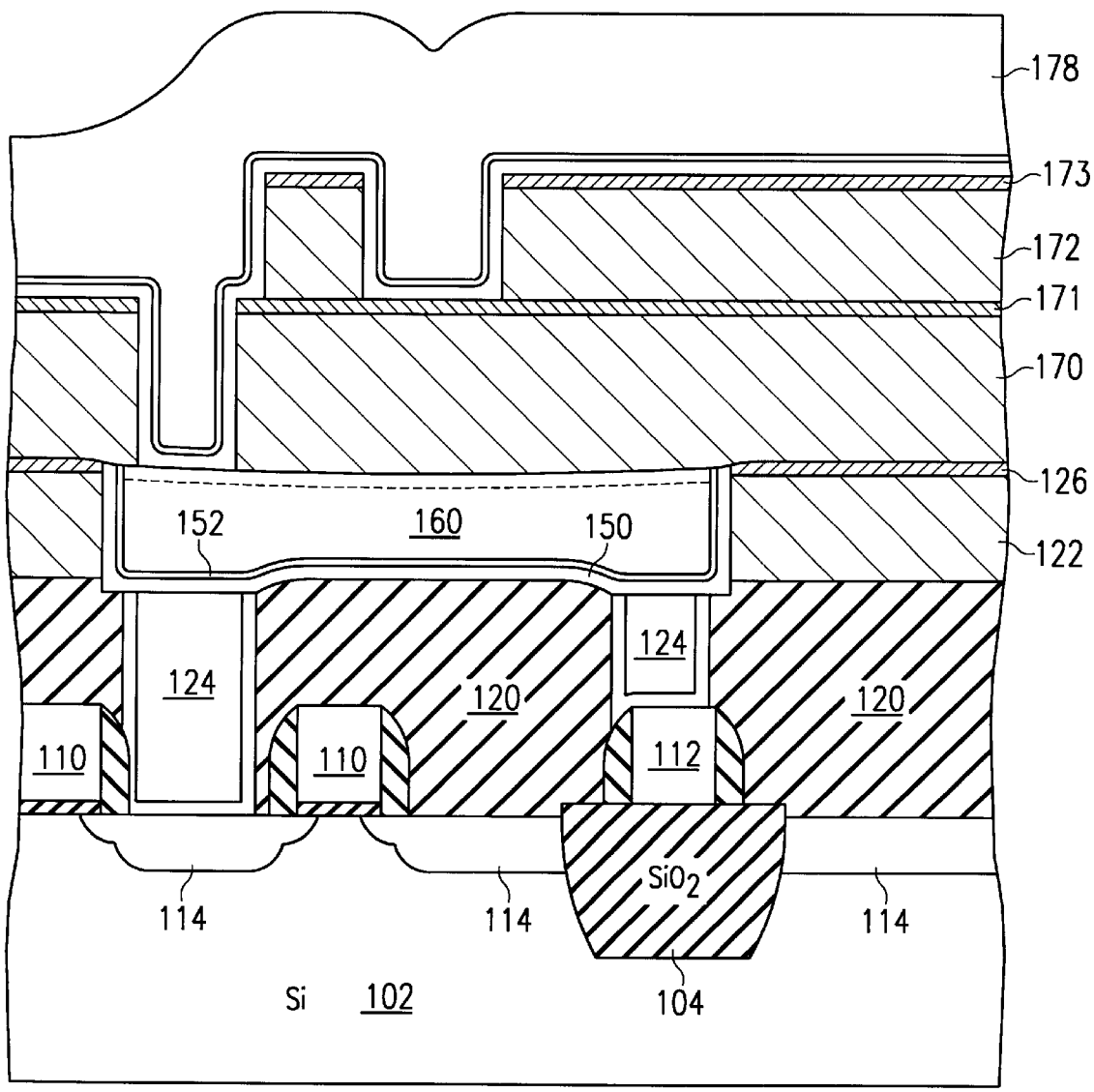

(16) Deposit 10–30 nm thick conformal TiN by CVD, deposit 50–100 nm thick seed layer copper by PVD or CVD, and electroplate 500–1000 nm thick copper to fill the trenches and vias. See FIG. 1k showing copper 178.

Figure 1L:
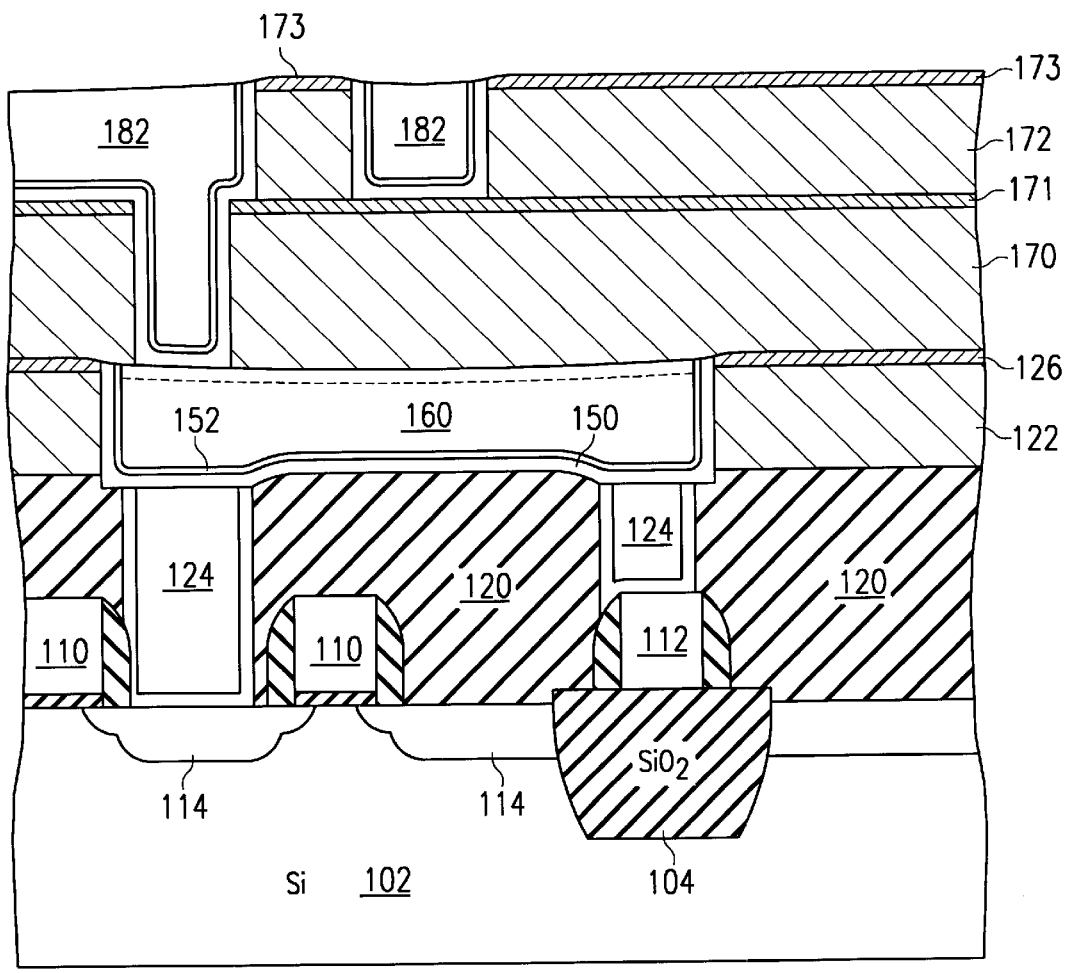

(17) Remove the copper outside of the interconnect trenches with CMP; again, silicon carbide 173 acts as a polish stop and diffusion barrier to protect xerogel 172. See FIG. 1l illustrating SiC 173 between copper interconnects 182.

(18) Passivate the exposed copper (e.g., thin SiC or nitride deposition) to complete the next level interconnects.

Repeat for further metal levels, although the top (and other metal levels) need not be planarized and may have other metals such as aluminum, clad aluminum, and tungsten.

Note that the 10 nm thick SiC 173 between adjacent interconnects 182 is roughly 3% of the dielectric between the 300 nm high interconnects; so the SiC increases the effective dielectric constant by roughly 5% if the xerogel has a dielectric constant of 2.0.

Second Preferred Embodiment

A further preferred embodiment applies a thin (e..g, 20 nm) layer of hydrogen silsequioxane (HSQ) to the surface of the xerogel to act as an adhesion layer for the deposition of the silicon carbide. HSQ has a low dielectric constant (k=3.0), so this adhesion layer does not greatly affect the effective dielectric constant between the interconnects.

Third Preferred Embodiment

A further preferred embodiment. removes the etch stop layer from the lower three or four levels or alternatively all interconnect levels. The trench etches are then time controlled and depend upon good process control.

Modifications

The preferred embodiments can be modified in various ways while retaining the feature of a silicon carbide polish stop on a xerogel dielectric with dual in laid (dual damascene) metallization. For example, the dielectrics could be differing between various levels and composites of various sublayers of differing materials; the dimensions of the various parts could varied, other semiconductor substrate and gate materials could be used, and other depositions and etches are available.

What is claimed is:

1. A method of inlaid interconnect fabrication, comprising the steps of:

(a) provide a dielectric layer;

(b) form a silicon carbide layer on said dielectric layer;

(c) form vias and trenches in said silicon carbide and dielectric layers;

(d) deposit conducting material on said silicon carbide and dielectric; and (e) planarize to remove said conducting material outside of said vias and trenches with said silicon carbide as a planarization stop.

2. The method of claim 1, wherein:

(a) said planarize is by chemical mechanical polishing.

* * * * *